(12) United States Patent
Tanaka et al.

(10) Patent No.: US 10,886,887 B2
(45) Date of Patent: Jan. 5, 2021

(54) ALUMINUM NITRIDE FILM, ACOUSTIC WAVE DEVICE, FILTER, AND MULTIPLEXER

(71) Applicant: TAIYO YUDEN CO., LTD., Tokyo (JP)

(72) Inventors: Kuniaki Tanaka, Tokyo (JP); Tokihiro Nishihara, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 283 days.

(21) Appl. No.: 16/001,152

(22) Filed: Jun. 6, 2018

(65) Prior Publication Data

US 2018/0375489 A1 Dec. 27, 2018

(30) Foreign Application Priority Data

Jun. 23, 2017 (JP) .................................. 2017-123213
May 8, 2018 (JP) .................................. 2018-089980

(51) Int. Cl.
| H03H 9/02 | (2006.01) |
| H03H 3/02 | (2006.01) |
| H03H 9/13 | (2006.01) |
| H03H 9/17 | (2006.01) |
| H03H 9/56 | (2006.01) |
| H03H 9/70 | (2006.01) |

(52) U.S. Cl.
CPC .......... *H03H 9/02015* (2013.01); *H03H 3/02* (2013.01); *H03H 9/02118* (2013.01); *H03H 9/131* (2013.01); *H03H 9/173* (2013.01); *H03H 9/175* (2013.01); *H03H 9/564* (2013.01); *H03H 9/568* (2013.01); *H03H 9/706* (2013.01); *H03H 2003/021* (2013.01); *H03H 2003/025* (2013.01)

(58) Field of Classification Search
CPC .. H03H 9/02015; H03H 3/02; H03H 9/02118; H03H 9/131; H03H 9/173; H03H 9/175; H03H 9/564; H03H 9/568; H03H 9/706; H03H 2003/021; H03H 2003/025
USPC ...................................................... 333/133
See application file for complete search history.

(56) References Cited

U.S. PATENT DOCUMENTS

| 2012/0107557 A1 | 5/2012 | Akiyama et al. |
| 2013/0241673 A1 | 9/2013 | Yokoyama et al. |
| 2014/0167560 A1 | 6/2014 | Onda |

FOREIGN PATENT DOCUMENTS

| JP | 2011-015148 A | 1/2011 |
| JP | 2013-219743 A | 10/2013 |

OTHER PUBLICATIONS

Alfred Raul Gimenez Bonastre, "RF Filters and Multiplexers based on Acoustic wave technologies with ladder type and cross coupled topologies", Ph.D. thesis, Universitat Autononna de Barcelona (UAB), Sep. 2016, chapter 1. (Year: 2016).*

* cited by examiner

*Primary Examiner* — Benny T Lee
*Assistant Examiner* — Hafizur Rahman
(74) *Attorney, Agent, or Firm* — Chen Yoshimura LLP (57) ABSTRACT

An aluminum nitride film contains a Group IV element and a Group II or Group XII element, and an atomic composition ratio of the Group II or Group XII element to the Group IV element is less than 1.

11 Claims, 8 Drawing Sheets

ALUMINUM NITRIDE FILM, ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2017-123213, filed on Jun. 23, 2017, and the prior Japanese Patent Application No. 2018-089980, filed on May 8, 2018, the entire contents of which are incorporated herein by reference.

FIELD

A certain aspect of the present invention relates to an aluminum nitride film, an acoustic wave device, a filter, and a multiplexer.

BACKGROUND

Aluminum nitride films have been used as piezoelectric films in acoustic wave devices such as piezoelectric thin film resonators. It has been known that the piezoelectricity is improved by adding scandium to the aluminum nitride film as disclosed in, for example, Japanese Patent Application Publication No. 2011-15148 (hereinafter, referred to as Patent Document 1). It has been also known that the piezoelectricity is improved by adding a Group IV element and a Group II element to the aluminum nitride film in the same proportion as disclosed in, for example, Japanese Patent Application Publication No. 2013-219743 (hereinafter, referred to as Patent Document 2).

SUMMARY OF THE INVENTION

According to a first aspect of the present invention, there is provided an aluminum nitride film containing a Group IV element and a Group II or Group XII element, an atomic composition ratio of the Group II or Group XII element to the Group IV element being less than 1.

According to a second aspect of the present invention, there is provided an acoustic wave device including: the above aluminum nitride film, and an electrode that excites an acoustic wave propagating through the aluminum nitride film.

According to a third aspect of the present invention, there is provided an acoustic wave device including: a resonator including: a substrate, the above aluminum nitride film located on the substrate, and a lower electrode and an upper electrode facing each other across at least a part of the aluminum nitride film.

According to a fourth aspect of the present invention, there is provided a filter including the above acoustic wave device.

According to a fifth aspect of the present invention, there is provided a multiplexer including the above filter.

DETAILED DESCRIPTION

As described in Patent Document 2, when a Group II element (e.g., magnesium (Mg), calcium (Ca), or strontium (Sr)) or a Group XII element (e.g., zinc (Zn)) and a Group IV element (e.g., hafnium (Hf), titanium (Ti), or zirconium (Zr)) are added to an aluminum nitride film mainly composed of aluminum nitride in the same atomic proportion, the electromechanical coupling coefficient is improved. This is considered because making the atomic ratio of the Group II or Group XII element and the Group IV element 1:1 enables to maintain electroneutrality. However, a preferable atomic ratio of the Group II or Group XII element and the Group IV element has not been examined. Thus, the preferable atomic ratio of the Group II or Group XII element and the Group IV element was examined. The name of the group of the element is as per description by International Union of Pure and Applied Chemistry (IUPAC).

First Embodiment

Figure 1A:
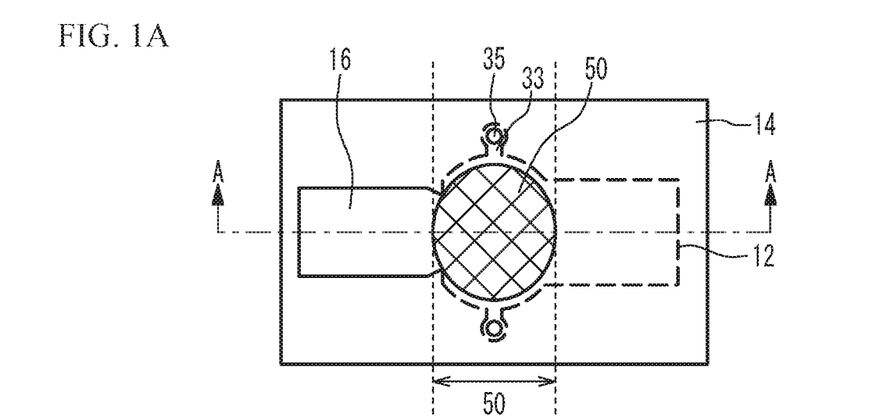
FIG. 1A is a plan view of a piezoelectric thin film resonator in accordance with a first embodiment.
Figure 1B:
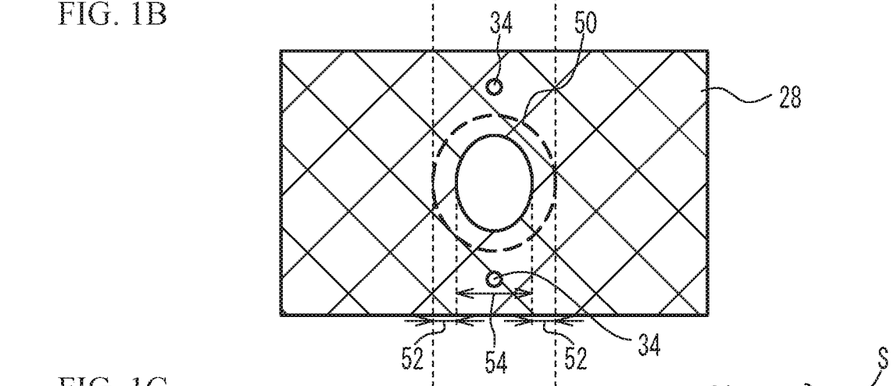
FIG. 1B is a plan view of an insertion film.
Figure 1C:
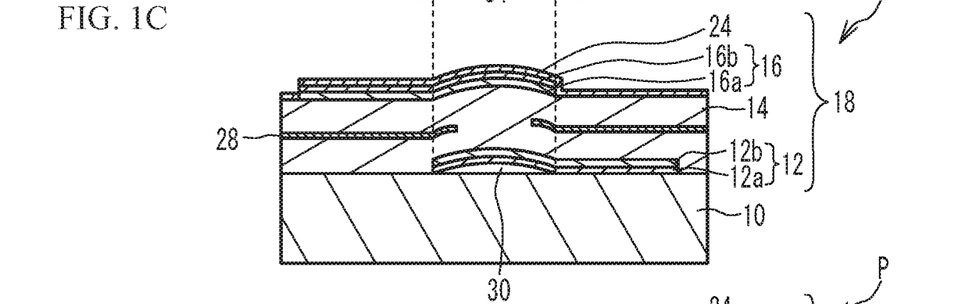
FIG. 1C and FIG. 1D are cross-sectional views taken along line A-A in FIG. 1A.
Figure 1D:
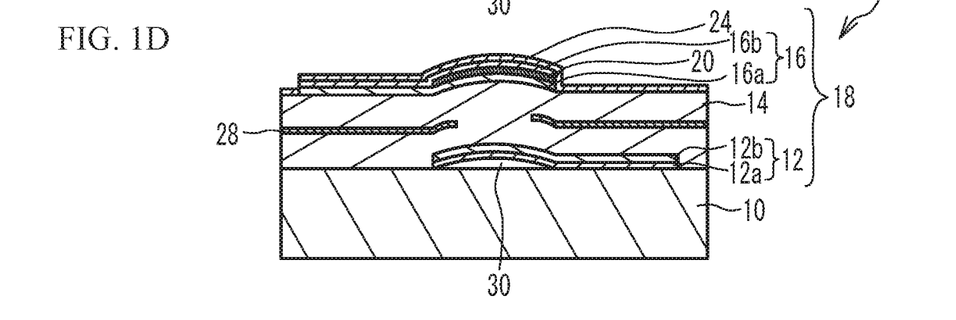

FIG. 1A is a plan view of a piezoelectric thin film resonator in accordance with a first embodiment, FIG. 1B is a plan view of an insertion film, and FIG. 1C and FIG. 1D are cross-sectional views taken along line A-A in FIG. 1A. FIG. 1C is a cross-sectional view of, for example, a series resonator of a ladder-type filter, and FIG. 1D is a cross-sectional view of, for example, a parallel resonator of the ladder-type filter.

Referring to FIG. 1A through FIG. 1C, the structure of a series resonator S will be described. A lower electrode 12 is located on a substrate 10. An air gap 30 having a dome-shaped bulge is formed between the flat principal surface of the substrate 10 and the lower electrode 12. The dome-shaped bulge is a bulge having a shape in which the height of the air gap 30 is small in the periphery of the air gap 30, and increases at smaller distances to the center of the air gap 30, for example. The substrate 10 is, for example, a silicon (Si) substrate. The lower electrode 12 includes a lower layer 12a and an upper layer 12b. The lower layer 12a is, for example, a chrome (Cr) film, and the upper layer 12b is, for example, a ruthenium (Ru) film.

A piezoelectric film 14 is located on the lower electrode 12. The piezoelectric film 14 is an aluminum nitride film mainly composed of aluminum nitride having the main axis in the (002) direction, and to which a Group II or Group XII element and a Group IV element are added. An insertion film 28 is located in the piezoelectric film 14. The insertion film 28 is, for example, a silicon oxide film. The insertion film 28 is located in an outer peripheral region 52 within a resonance region 50, and is not located in a center region 54. The insertion film 28 is continuously located from the outer peripheral region 52 to the outside of the resonance region 50. Hole portions 34 corresponding to hole portions 35 are formed in the insertion film 28.

An upper electrode 16 is located on the piezoelectric film 14 so as to have a region (the resonance region 50) where the upper electrode 16 faces the lower electrode 12 across the piezoelectric film 14. The resonance region 50 has an elliptical shape, and is a region where the acoustic wave in the thickness extension mode resonates. The upper electrode 16 includes a lower layer 16a and an upper layer 16b. The lower layer 16a is, for example, an Ru film, and the upper layer 16b is, for example, a Cr film.

A silicon oxide film is formed as a frequency adjusting film 24 on the upper electrode 16. A multilayered film 18 within the resonance region 50 includes the lower electrode 12, the piezoelectric film 14, the insertion film 28, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 has the hole portions 35 at the ends of the introduction path 33.

With reference to FIG. 1A and FIG. 1D, the structure of a parallel resonator P will be described. The parallel resonator P differs from the series resonator S in that a mass load film 20 in FIG. 1D formed of a titanium (Ti) layer is located between the lower layer 16a and the upper layer 16b of the upper electrode 16. Thus, the multilayered film 18 includes the mass load film 20 formed across the entire surface in the resonance region 50 in addition to the multilayered film of the series resonator S. Other structures are the same as those of the series resonator S illustrated in FIG. 1C, and the description thereof is thus omitted.

The difference in resonant frequency between the series resonator S and the parallel resonator P is adjusted by changing the film thickness of the mass load film 20. The resonant frequency of each of the series resonator S and the parallel resonator P is adjusted by changing the film thickness of the corresponding frequency adjusting film 24.

When the piezoelectric thin film resonator has a resonant frequency of 2 GHz, the lower layer 12a, formed of a Cr film, of the lower electrode 12 has a film thickness of 100 nm, and the upper layer 12b formed of an Ru film has a film thickness of 250 nm. The piezoelectric film 14 formed of an AlN film has a film thickness of 1100 nm. The insertion film 28 formed of a silicon oxide film has a film thickness of 150 nm. The lower layer 16a, formed of an Ru film, of the upper electrode 16 has a film thickness of 250 nm, and the upper layer 16b formed of a Cr film has a film thickness of 50 nm. The frequency adjusting film 24 formed of a silicon oxide film has a film thickness of 50 nm. The mass load film 20 formed of a Ti film has a film thickness of 120 nm. The film thickness of each layer is appropriately set to achieve a desired resonance characteristic.

The substrate 10 may be a sapphire substrate, an alumina substrate, a spinel substrate, a quartz substrate, a glass substrate, a ceramic substrate, or a GaAs substrate instead of an Si substrate. The lower electrode 12 and the upper electrode 16 may be formed of a single-layer film of aluminum (Al), Ti, copper (Cu), molybdenum (Mo), tungsten (W), tantalum (Ta), platinum (Pt), rhodium (Rh), or iridium (Ir), or a multilayered film of at least two of them instead of Ru and Cr. For example, the lower layer 16a of the upper electrode 16 may be made of Ru, and the upper layer 16b may be made of Mo.

The insertion film 28 is made of a material having Young's modulus less than that of the piezoelectric film 14 and/or acoustic impedance less than that of the piezoelectric film 14. The insertion film 28 may be formed of a single-layer film of aluminum (Al), gold (Au), Cu, Ti, Pt, Ta, or Cr, or a multilayered film of at least two of them instead of silicon oxide.

The frequency adjusting film may be formed of a silicon nitride film or an aluminum nitride film instead of a silicon oxide film. The mass load film 20 may be a single-layer film of Ru, Cr, Al, Cu, Mo, W, Ta, Pt, Rh, or Ir instead of Ti. Alternatively, the mass load film 20 may be, for example, an insulating film made of metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower layer 16a and the upper layer 16b). The mass load film 20 may be larger than the resonance region 50 as long as it is formed so as to include the resonance region 50.

Figure 2A:
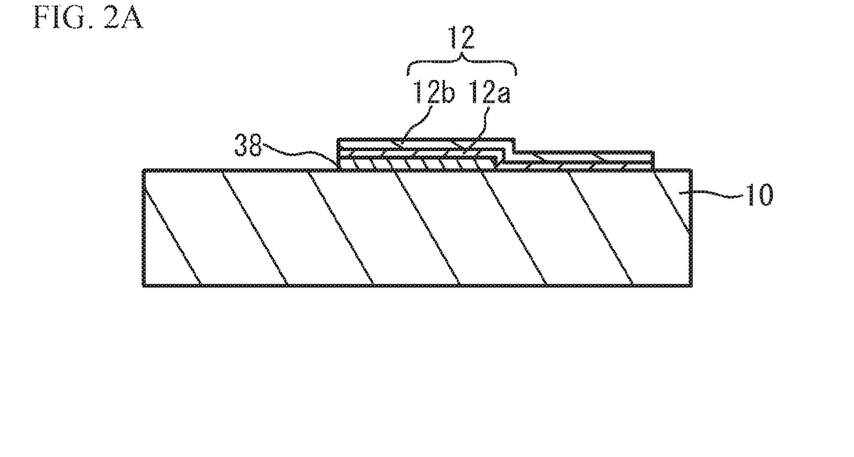
FIG. 2A through FIG. 2C are cross-sectional views illustrating a method of fabricating the piezoelectric thin film resonator in accordance with the first embodiment.
Figure 2B:
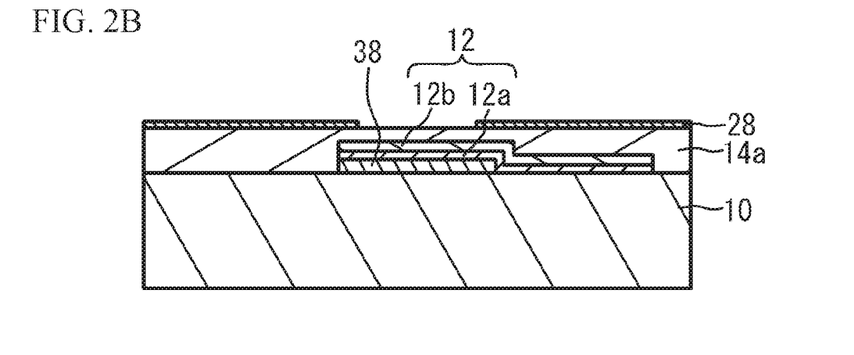
Figure 2C:
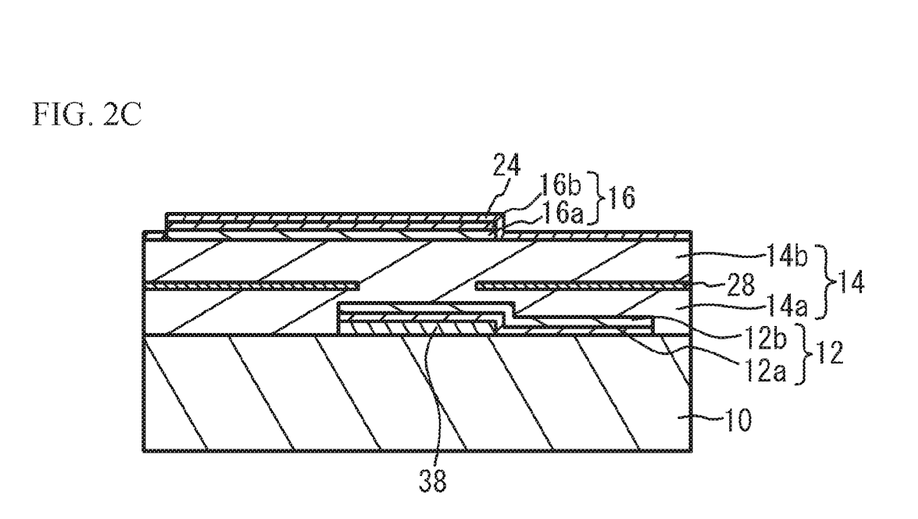

FIG. 2A through FIG. 2C are cross-sectional views illustrating a method of fabricating the series resonator of the first embodiment. As illustrated in FIG. 2A, a sacrifice layer 38 for forming an air gap is formed on the substrate 10 having a flat principal surface. The sacrifice layer 38 has a film thickness of, for example, 10 to 100 nm, and is made of a material such as MgO, ZnO, Ge, or $SiO_2$, which easily dissolves in an etching liquid or an etching gas. Thereafter, the sacrifice layer 38 is patterned into a desired shape by photolithography and etching. The shape of the sacrifice layer 38 corresponds to the planar shape of the air gap 30, and includes, for example, a region to be the resonance region 50. Then, the lower layer 12a and upper layer 12b are formed as the lower electrode 12 on the sacrifice layer 38 and the substrate 10. The sacrifice layer 38 and the lower electrode 12 are formed by, for example, sputtering, vacuum evaporation, or Chemical Vapor Deposition (CVD). Thereafter, the lower electrode 12 is patterned into a desired shape by photolithography and etching. The lower electrode 12 may be formed by liftoff.

As illustrated in FIG. 2B, a piezoelectric film 14a and the insertion film 28 are formed on the lower electrode 12 and the substrate 10 by, for example, sputtering, vacuum evaporation, or CVD. The insertion film 28 is patterned into a desired shape by photolithography and etching. The insertion film 28 may be formed by liftoff.

As illustrated in FIG. 2C, a piezoelectric film 14b and the lower layer 16a and the upper layer 16b of the upper electrode 16 are formed by, for example, sputtering, vacuum evaporation, or CVD. The piezoelectric films 14a and 14b form the piezoelectric film 14. The upper electrode 16 is patterned into a desired shape by photolithography and etching. The upper electrode 16 may be formed by liftoff.

One of methods for forming an aluminum nitride film, as the piezoelectric film 14, to which a Group II or Group XII element and a Group IV element are added is, for example, reactive sputtering. For example, atoms are sputtered from a target of an alloy of Al and a Group II element or an alloy of a Group XII element and a Group IV element in an atmosphere including nitrogen ($N_2$) gas (for example, a mixed gas of argon (Ar) and nitrogen) to react the sputtered atoms with nitrogen and deposit the resultant substance. Employed as a method for applying a voltage to the target is, for example, an AC magnetron sputtering method that applies an Alternating Current (AC) voltage to the target. Dual target reactive sputtering, which discharges electricity to two targets, which are a target of an alloy of Al and a Group II element or an alloy of a Group XII element and a Group IV element and an Al target, at the same time may be employed. Multi-target reactive sputtering, which discharges electricity to three targets, which are an Al target; a target of a Group II or Group XII element, and a target of a Group IV element, at the same time may be employed.

In the parallel resonator illustrated in FIG. 1D, after the formation of the lower layer 16a, the mass load film 20 is formed by, for example, sputtering, vacuum evaporation, or CVD. The mass load film 20 is patterned into a desired shape by photolithography and etching. Thereafter, the upper layer 16b is formed.

The frequency adjusting film 24 is formed by, for example, sputtering or CVD. The frequency adjusting film 24 is patterned into a desired shape by photolithography and etching.

Thereafter, an etching liquid for etching the sacrifice layer 38 is introduced into the sacrifice layer 38 under the lower electrode 12 through the hole portion 35 and the introduction path 33 (see FIG. 1A). This process removes the sacrifice layer 38. A substance for etching the sacrifice layer 38 is preferably a substance that does not etch the materials constituting the resonator except the sacrifice layer 38. In particular, a substance used for etching is preferably a substance that does not etch the lower electrode 12 with which the substance comes in contact. The stress of the multilayered film 18 (see FIG. 1C and FIG. 1D) is set so as to be a compression stress. This setting causes the multilayered film 18 to bulge out to the opposite side to the substrate 10 so as to separate from the substrate 10 when the sacrifice layer 38 is removed. The air gap 30 having a dome-shaped bulge is formed between the lower electrode 12 and the substrate 10. The above-described processes complete the series resonator S illustrated in FIG. 1A and FIG. 1C and the parallel resonator P illustrated in FIG. 1A and FIG. 1D.

Experiment

Fabricated were samples of piezoelectric thin film resonators including, as the piezoelectric film 14, aluminum nitride films to which Mg and Hf were added and having different atomic ratios of Mg and Hf. The fabrication conditions are as follows.

Lower layer 12a of the lower electrode 12: Cr film with a film thickness of 100 nm
Upper layer 12b of the lower electrode 12: Ru film with a film thickness of 210 nm
Piezoelectric film 14: Aluminum nitride film with a film thickness of 1150 nm
Insertion film 28: Silicon oxide film with a film thickness of 150 nm
Lower layer 16a of the upper electrode 16: Ru film with a film thickness of 230 nm
Upper layer 16b of the upper electrode 16: Cr film with a film thickness of 20 nm
Frequency adjusting film 24: Silicon oxide film with a film thickness of 50 nm
Mass load film 20: Not provided The aluminum nitride films were formed by reactive sputtering using AC magnetron sputtering. Two targets, which are an Al—Mg—Hf alloy target and an Al target, were used. Samples with different atomic ratios of Mg and Hf were fabricated by changing the atomic ratio of Mg and Hf in the Al—Mg—Hf alloy target. The concentrations of Mg and Hf in aluminum nitride were changed by changing AC electrical power applied to the Al—Mg—Hf alloy target and the Al target.

Targets having the following five compositions were used as the Al—Mg—Hf alloy target. Table 1 lists the composition ratios (atomic %) of Mg, Hf and Al in targets A through E.

TABLE 1

| Target | Composition | | |
|---|---|---|---|
| | Mg (atomic %) | Hf (atomic %) | Al (atomic %) |
| A | 0 | 12 | 88 |
| B | 4 | 12 | 84 |
| C | 7 | 12 | 81 |
| D | 12 | 12 | 76 |
| E | 14 | 12 | 74 |

The electromechanical coupling coefficient $k^2$ and the FOM of each fabricated sample were measured. The FOM is calculated from the following formula.

$$\text{electromechanical coupling coefficient} \times \sqrt{Q \text{ value at resonant frequency} \times Q \text{ value at antiresonant frequency}}$$

The concentrations of Mg and Hf in the piezoelectric film 14 of each sample was measured by the Electron Probe Micro Analyzer (EPMA) method. Mg/Hf represents the atomic ratio of Mg to Hf. The Hf concentration represents the atomic concentration of Hf with respect to the sum of Al, Mg and Hf in the aluminum nitride film.

Figure 3A:
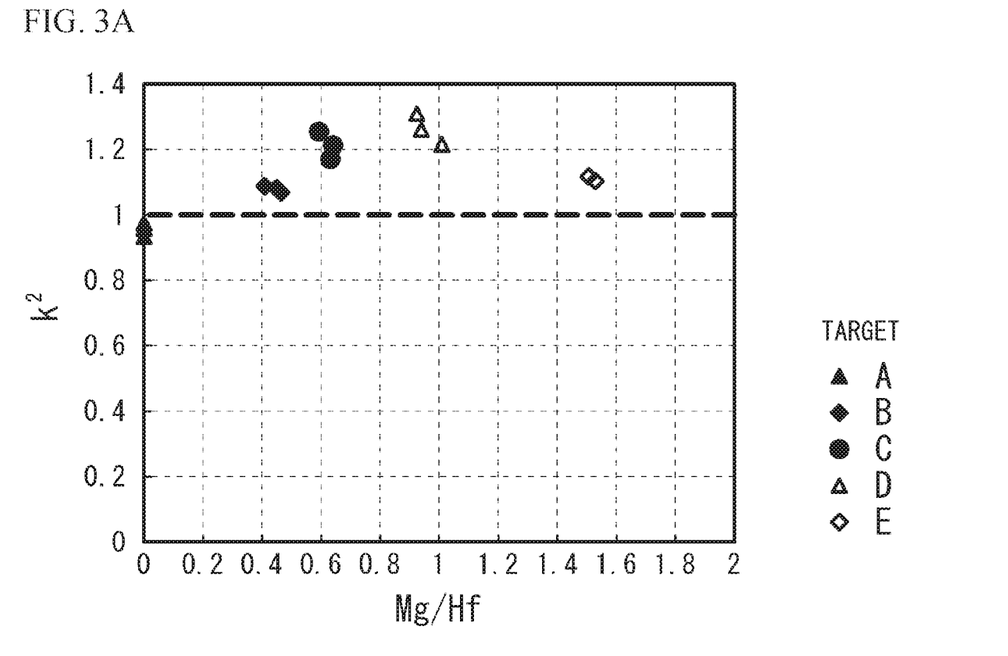
FIG. 3A is a graph of an electromechanical coupling coefficient $k^2$ versus Mg/Hf.
Figure 3B:
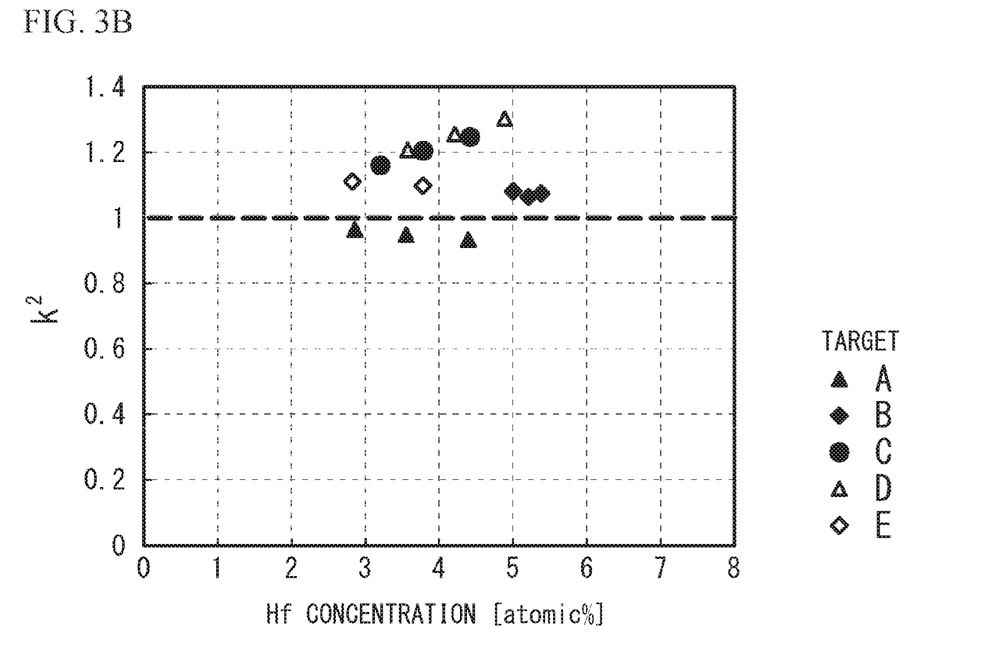
FIG. 3B is a graph of an electromechanical coupling coefficient $k^2$ versus Hf concentration.
Figure 4A:
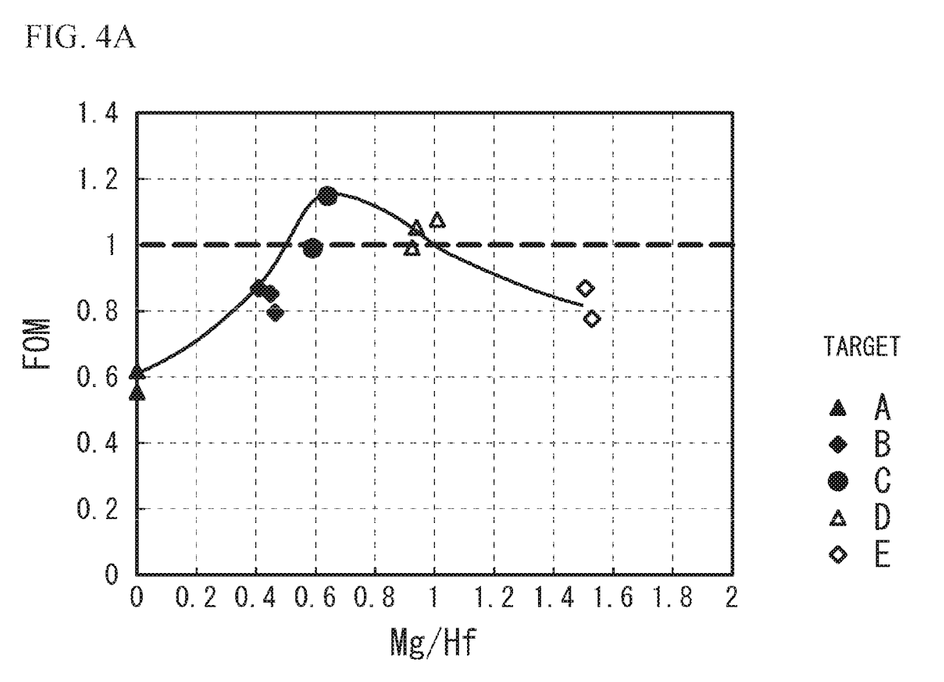
FIG. 4A is a graph of an FOM versus Mg/Hf.
Figure 4B:
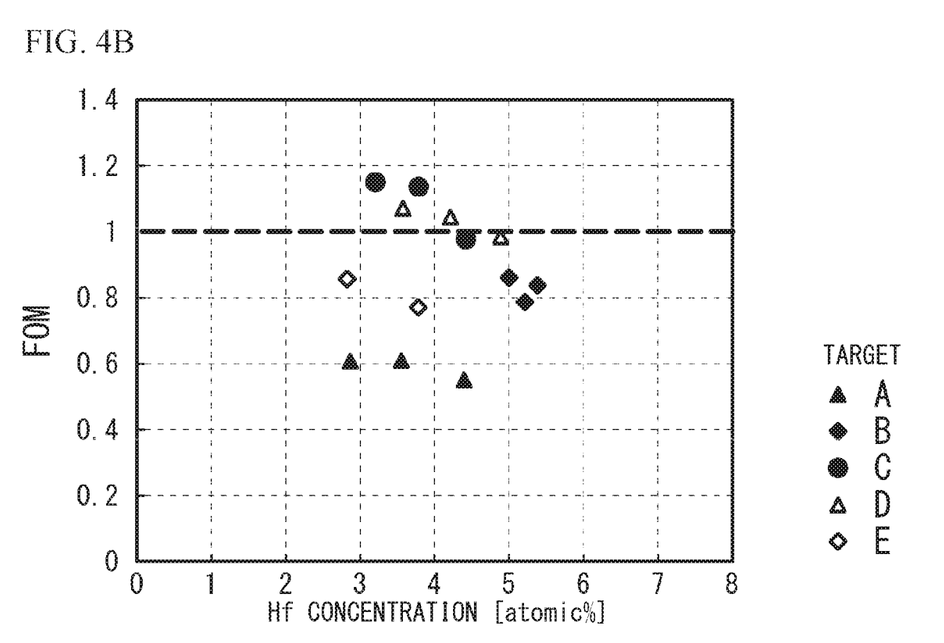
FIG. 4B is a graph of an FOM versus Hf concentration.

FIG. 3A is a graph of an electromechanical coupling coefficient $k^2$ versus Mg/Hf, and FIG. 3B is a graph of an electromechanical coupling coefficient $k^2$ versus Hf concentration. FIG. 4A is a graph of an FOM versus Mg/Hf, and FIG. 4B is a graph of an FOM versus Hf concentration. The electromechanical coupling coefficient $k^2$ and the FOM are respectively normalized by those of a pure aluminum nitride film to which neither Mg nor Hf is added. In FIG. 3A through FIG. 4B, the values of the pure aluminum nitride film are indicated by bold dashed lines.

As illustrated in FIG. 3A, when Mg/Hf is 0, the normalized $k^2$ is 1 or slightly less than 1. This indicates that the addition of Hf alone to an aluminum nitride film does not improve $k^2$. When Mg/Hf is 1, $k^2$ reaches a maximum. When Mg/Hf is in the range of 0.4 to 1.53, $k^2$ is 1 or greater. As illustrated in FIG. 3B, in the samples using the targets C and D, as the Hf concentration increases, $k^2$ tends to increase. However, in the samples using other targets, such a trend of $k^2$ with respect to the Hf concentration is hardly observed.

As illustrated in FIG. 4A, the FOM reaches a maximum when Mg/Hf is in the range of 0.6 to 0.8. The FOM is greater than that of pure aluminum nitride when Mg/Hf is 0.5 or greater and less than 1.0. When it is assumed that the point at which the FOM of the target C is 1 is a critical point, the FOM is greater than that of pure aluminum nitride when Mg/Hf is approximately 0.58 or greater. As illustrated in FIG. 4B, the FOM monotonically decreases with respect to the Hf concentration.

As illustrated in FIG. 3B and FIG. 4B, the electromechanical coupling coefficient $k^2$ and the FOM do not depend much on the Hf concentration. As illustrated in FIG. 3A, the electromechanical coupling coefficient $k^2$ reaches a maximum when Mg/Hf is approximately 1. As illustrated in FIG. 4A, the FOM is large when Mg/Hf is less than 1.

It is not clear why the FOM reaches a maximum when Mg/Hf is less than 1, but it is considered, for example, as follows. Mg and Hf substitute for Al in the aluminum nitride film. Since Al, Mg, and Hf are respectively trivalent, divalent, and tetravalent, the electric charge is compensated and electrically neutralized by making the atomic ratio of Mg and Hf 1:1. However, Hf may be trivalent and divalent in addition to tetravalent. On the other hand, Mg is not likely to be other than divalent. For example, Hf reacts with $N_2$ by reactive sputtering, and HfN containing trivalent Hf may be produced. When part of Hf in the aluminum nitride film is trivalent and Mg/Hf is 1, electrons are excessive, and electroneutrality is not achieved. This decreases the insulation property in the aluminum nitride film. This reduces the Q-value, resulting in the reduction of the FOM. Thus, to maintain the electroneutrality in the aluminum nitride film, Mg/Hf is preferably made to be less than 1. For example, when it is assumed that electroneutrality is achieved at Mg/Hf=0.5 and the valence of Hf is trivalent and tetravalent, the ratio of tetravalent Hf to trivalent Hf is 1.

The Group IV element such as Ti, Zr, and Hf may be trivalent and divalent in addition to tetravalent. On the other hand, the Group II element such as beryllium (Be), Mg, Ca, Sr, and barium (Ba) is rarely other than divalent. Thus, the silicon nitride film used as the piezoelectric film 14 is configured to contain a Group IV element and a Group II element, and the atomic composition ratio of the Group II element to the Group IV element is made to be less than 1. This configuration improves the FOM. In addition, the Group XII element may be monovalent in addition to divalent. When the Group XII element is monovalent, the electric charge of the Group IV element is compensated even when the amount of the Group XII element is small. Thus, by making the atomic composition ratio of the Group XII element to the Group IV element less than 1, the FOM is improved. The atomic composition ratio of the Group II or Group XII element to the Group IV element is preferably 0.9 or less, more preferably 0.8 or less.

As illustrated in FIG. 4A, the atomic composition ratio of the Group II or Group XII element to the Group IV element is preferably 0.5 or greater, more preferably 0.6 or greater.

As illustrated in FIG. 4B, to make the FOM 1 or greater, the Hf concentration is preferably 5 atomic % or less, more preferably 4 atomic % or less. Additionally, the Hf concentration is preferably 1 atomic % or greater, more preferably 2 atomic % or greater.

The Group IV element and the Group II or Group XII element substitute for aluminum. Accordingly, the FOM is improved.

To easily form the aluminum nitride film, the Group IV element is preferably at least one of Ti, Zr, and Hf, and the Group II or Group XII element is preferably at least one of Mg, Ca, and Sr.

First Variation of the First Embodiment

Figure 5A:
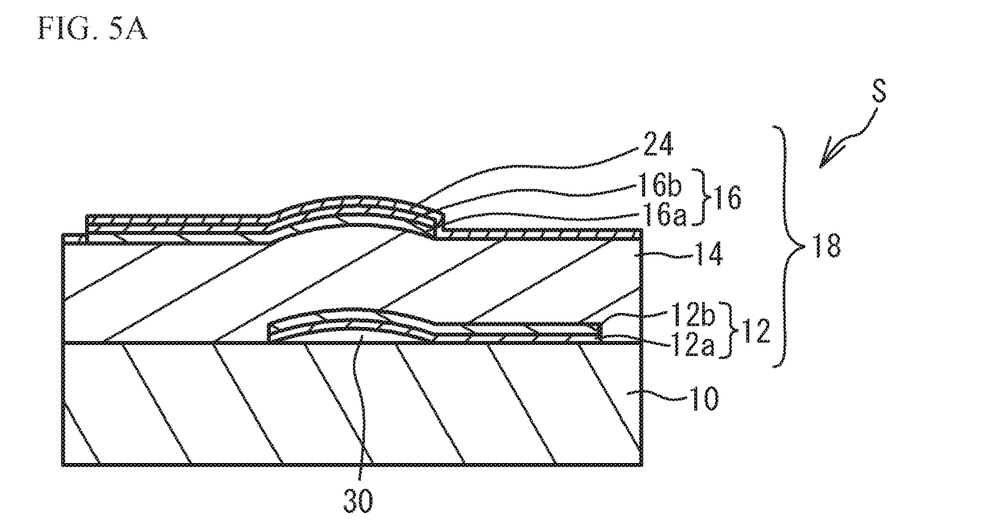
FIG. 5A and FIG. 5B are cross-sectional views of a piezoelectric thin film resonator in accordance with a first variation of the first embodiment.
Figure 5B:
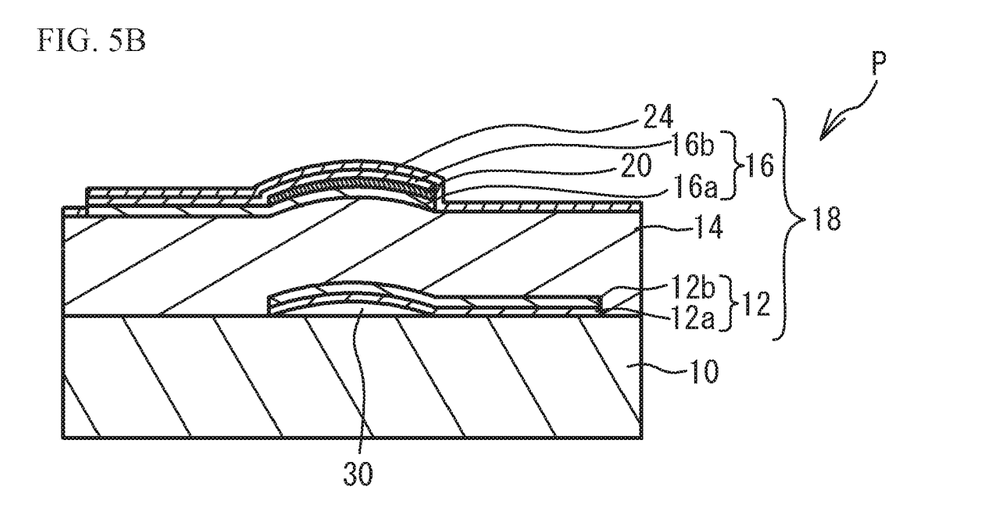

FIG. 5A and FIG. 5B are cross-sectional views of a piezoelectric thin film resonator in accordance with a first variation of the first embodiment. FIG. 5A is a cross-sectional view of, for example, a series resonator of a ladder-type filter, and FIG. 5B is a cross-sectional view of, for example, a parallel resonator of the ladder-type filter.

As illustrated in FIG. 5A and FIG. 5B, the insertion film 28 may not be necessarily provided. Other structures are the same as those of the first embodiment, and the description thereof is thus omitted.

Second Variation of the First Embodiment

Figure 6A:
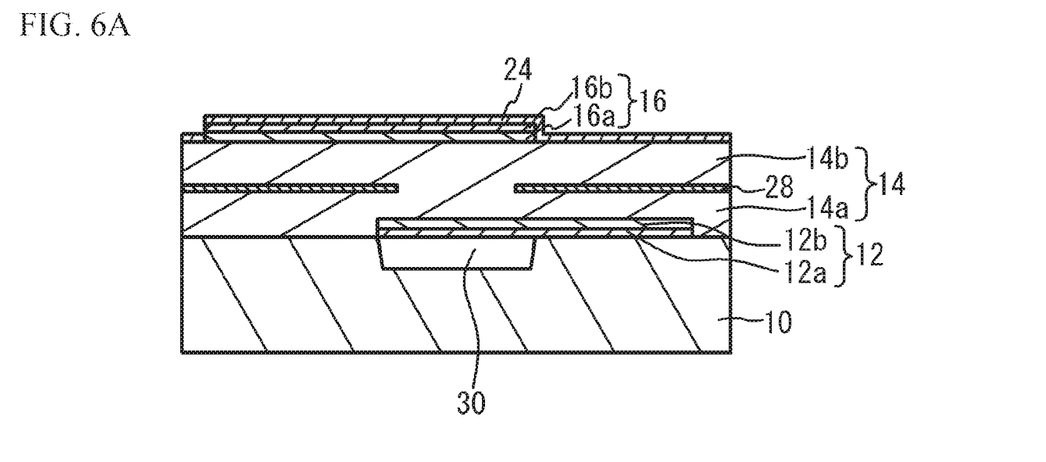
FIG. 6A and FIG. 6B are cross-sectional views of piezoelectric thin film resonators in accordance with second and third variations of the first embodiment, respectively.
Figure 6B:
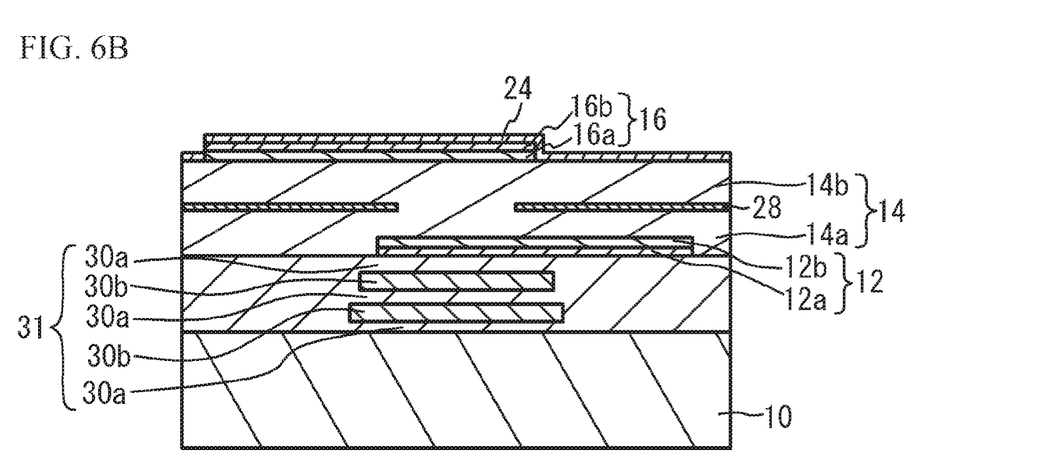

Second and third variations of the first embodiment change the structure of the air gap. FIG. 6A and FIG. 6B are cross-sectional views of piezoelectric thin film resonators in accordance with the second and third variations of the first embodiment, respectively. As illustrated in FIG. 6A, a recessed portion is formed on the upper surface of the substrate 10. The lower electrode 12 is flatly formed on the substrate 10. This forms the air gap 30 in the recessed portion of the substrate 10. The air gap 30 is formed so as to include the resonance region 50. Other structures are the same as those of the first embodiment, and the description thereof is thus omitted. The air gap 30 may be formed so as to penetrate through the substrate 10.

Third Variation of the First Embodiment

As illustrated in FIG. 6B, an acoustic mirror 31 is formed under the lower electrode 12 in the resonance region 50. The acoustic mirror 31 includes a film 30a with low acoustic impedance and a film 30b with high acoustic impedance alternately provided. Each of the films 30a and 30b has a film thickness of, for example, $\lambda/4$ ($\lambda$ is the wavelength of the acoustic wave). The number of the films 30a and the films 30b that are stacked is freely selected. It is sufficient if the acoustic mirror 31 is formed by stacking at least two layers with different acoustic characteristics at intervals. The substrate 10 may be one of two layers with different acoustic characteristics of the acoustic mirror 31. For example, the acoustic mirror 31 may have a structure in which a single film with acoustic impedance different from that of the substrate 10 is located in the substrate 10. Other structures are the same as those of the first embodiment, and the description thereof is thus omitted.

In the first embodiment and the first variation thereof, the air gap 30 may be formed as in the second variation of the first embodiment, or the acoustic mirror 31 may be formed instead of the air gap 30 as in the third variation of the first embodiment.

As in the first embodiment and the first and second variations thereof, the piezoelectric thin film resonator may be a Film Bulk Acoustic Resonator (FBAR) in which the air gap 30 is formed between the substrate 10 and the lower electrode 12 in the resonance region 50. Alternatively, as in the third variation of the first embodiment, the piezoelectric thin film resonator may be a Solidly Mounted Resonator (SMR) including the acoustic mirror 31 that reflects an acoustic wave propagating through the piezoelectric film 14 under the lower electrode 12 in the resonance region 50. It is sufficient if an acoustic reflection layer including the resonance region 50 includes the air gap 30 or the acoustic mirror 31.

In the first embodiment and the second and third variations thereof, the insertion film 28 is located in the outer peripheral region 52 of the resonance region 50. However, it is sufficient if the insertion film 28 is located at least a part of the outer peripheral region 52 of the resonance region 50.

The insertion film 28 may not be necessarily located outside the resonance region 50. As in the first variation of the first embodiment, the insertion film 28 may not be necessarily provided. The elliptical shape has been described as an example of the planar shape of the resonance region 50, but the planar shape of the resonance region 50 may be a polygonal shape such as a quadrangle shape or a pentagonal shape.

The first embodiment and the variations thereof have described the piezoelectric thin film resonator as an example of the acoustic wave device including an aluminum nitride film, but the acoustic wave device including an aluminum nitride film may be an acoustic wave device having an electrode exciting the acoustic wave propagating through the aluminum nitride film. The acoustic wave device including an aluminum nitride film may be, for example, a resonator using Lamb Wave in which a comb-shaped electrode is located on the aluminum nitride film. Use of an aluminum nitride film having a composition ratio of a Group II or Group XII element to a Group IV element less than 1 achieves the resonator having a large FOM.

The aluminum nitride film having a composition ratio of a Group II or Group XII element to a Group IV element less than 1 may be used for a piezoelectric body such as a sensor or actuator instead of the acoustic wave device.

Second Embodiment

Figure 7A:
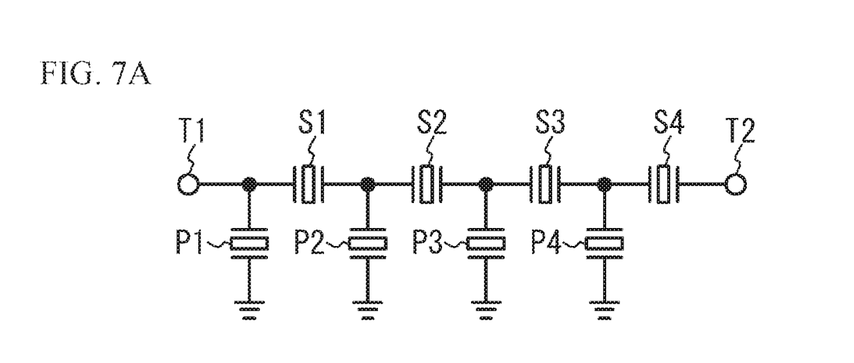
FIG. 7A is a circuit diagram of a filter in accordance with a second embodiment.

A second embodiment is an exemplary filter and an exemplary duplexer including the piezoelectric thin film resonator according to any one of the first embodiment and the variations thereof. FIG. 7A is a circuit diagram of a filter in accordance with a second embodiment. As illustrated in FIG. 7A, between an input terminal T1 and an output terminal T2, one or more series resonators S1 through S4 are connected in series. Between the input terminal T1 and the output terminal T2, one or more parallel resonators P1 through P4 are connected in parallel. At least one of the one or more series resonators S1 through S4 and the one or more parallel resonators P1 through P4 may be the piezoelectric thin film resonator according to any one of the first embodiment and the variations thereof. The number of resonators in the ladder-type filter is freely selected.

Figure 7B:
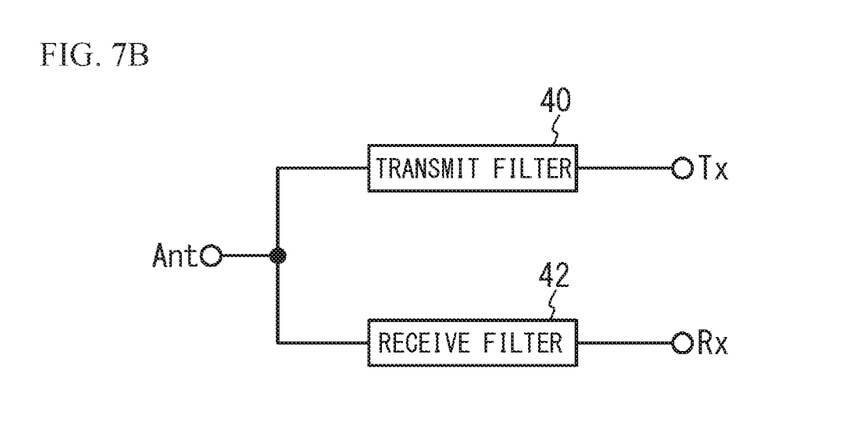
FIG. 7B is a circuit diagram of a duplexer in accordance with a first variation of the second embodiment.

FIG. 7B is a circuit diagram of a duplexer in accordance with a first variation of the second embodiment. As illustrated in FIG. 7B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the second embodiment.

The duplexer has been described as an example of the multiplexer, but the multiplexer may be a triplexer or a quadplexer.

Evaluation of the Valence of Hafnium in an Aluminum Nitride Film

The valence of hafnium in the aluminum nitride film fabricated in the above experiment was evaluated with Hard X-ray PhotoElectron Spectroscopy (HAXPES) in the SPring-8. In typical X-ray Photo electron Spectroscopy (XPS), the excitation energy of X-rays is approximately 3 keV, and the penetration depth of X-rays into the aluminum nitride film is approximately 10 nm. The excitation energy of X-rays was set at 8 keV by using HAXPES. This allows the penetration depth of X-rays to be 80 to 100 nm. Accordingly, the valence in the deeper region of the aluminum nitride film is precisely evaluated.

Table 2 lists the Mg concentrations and the Hf concentrations of the evaluated samples A through C.

TABLE 2

|  | Mg (atomic %) | Hf (atomic %) | $Hf^{4+}/(Hf^{4+} + Hf^{3+})$ |
| --- | --- | --- | --- |
| Sample A | 6.50 | 6.50 | 0.93 |
| Sample B | 1.59 | 3.38 | 0.90 |
| Sample C | 1.99 | 3.19 | 0.93 |

As presented in Table 2, the Mg concentration and the Hf concentration of the sample A are 6.5 atomic % and 6.5 atomic %, respectively. The Mg concentration and the Hf concentration of the sample B are 1.59 atomic % and 3.38 atomic %, respectively. The Mg concentration and the Hf concentration of the sample C are 1.99 atomic % and 3.19 atomic %, respectively.

Figure 8:
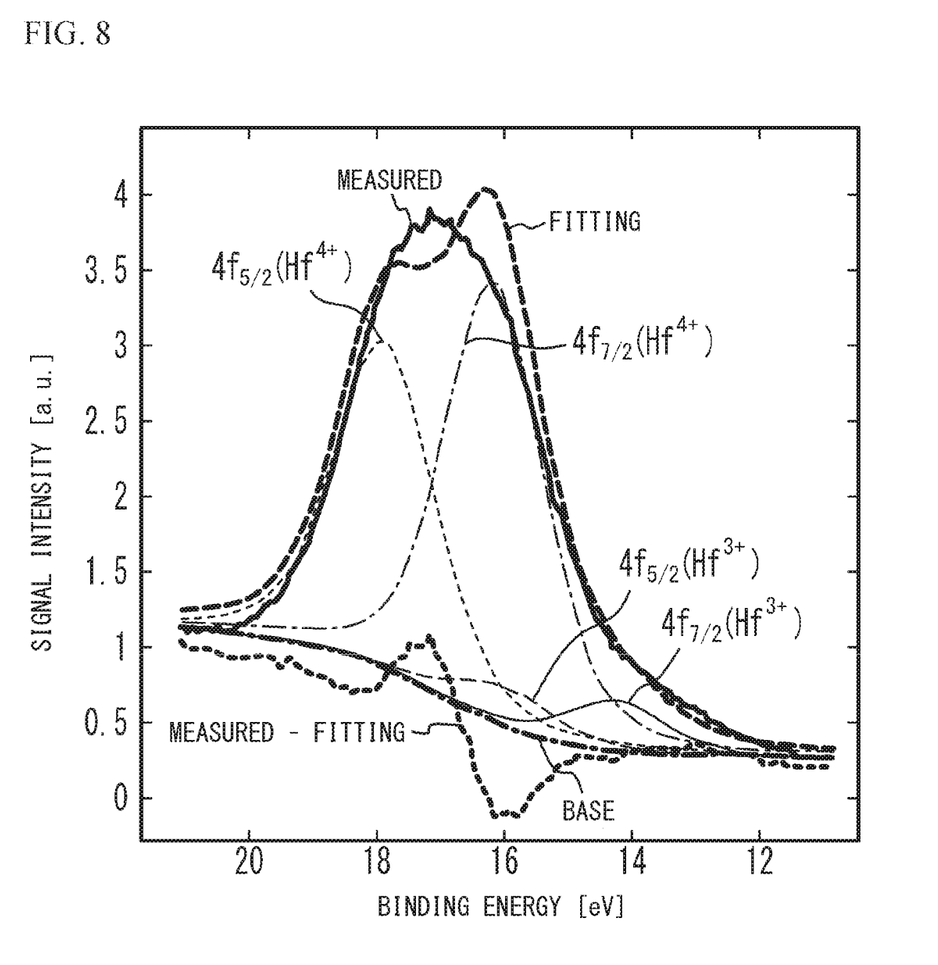
FIG. 8 is a graph of signal intensity versus binding energy in a sample B.

Evaluation conditions of HAXPES are as follows.
Excitation energy: 8 keV
Photoelectron extraction angle: 89°
Optical size: 30 μm×30 μm FIG. 8 is a graph of signal intensity (in a.u., arbitrary unit) versus binding energy in the sample B. In FIG. 8, "measured" indicates measured spectrum. "Base" indicates a base portion without signals of measured spectrum. The peak of the $4f_{5/2}$ orbital of tetravalent Hf is indicated by $4f_{5/2}$ ($Hf^{4+}$), and the peak of the $4f_{7/2}$ orbital of tetravalent Hf is indicated by $4f_{7/2}$ ($Hf^{4+}$). The peak of the $4f_{5/2}$ orbital of trivalent Hf is indicated by 4f512 ($Hf^{3+}$), and the peak of the 4f712 orbital of trivalent Hf is indicated by 4f712 ($Hf^{3+}$). "Fitting" indicates a curve combining the four peaks. "Measured—fitting" indicates a signal obtained by subtracting the "fitting" curve from the "measured" curve. The "fitting" curve was determined by changing the magnitudes of four peaks so that the difference between "measured—fitting" and "base" is minimal.

Fitting conditions are as follows.
Function of each peak: 60% Gauss-Lorents
Energy difference between the $4f_{5/2}$ peak and the $4f_{7/2}$ peak: 1.71 eV
Energy difference between the $Hf^{4+}$ peak and the $Hf^{3+}$ peak: 1.90 eV
$4f_{5/2}$ peak area/$4f_{7/2}$ peak area: 0.75

The atomic ratio of tetravalent Hf to the sum of tetravalent Hf and trivalent Hf (i.e., $Hf^{4+}/(Hf^{4+}+Hf^{3+})$) was calculated from the ratio of the heights of the $4f_{5/2}$ ($Hf^{4+}$) peak and the $4f_{7/2}$ ($Hf^{4+}$) peak and the heights of the $4f_{5/2}$ ($Hf^{3+}$) peak and the $4f_{7/2}$ ($Hf^{3+}$) peak. Table 2 also lists $Hf^{4+}/(Hf^{4+}+Hf^{3+})$ in the samples A through C. The atomic ratio $Hf^{4+}/(Hf^{4+}+Hf^{3+})$ is approximately 0.9 to 0.93, and are in the same range regardless of the Mg concentration and the Hf concentration.

As evaluated above, most of Hf in the aluminum nitride film is tetravalent, and trivalent Hf is partially contained. Zero-valent Hf is not contained. As described above, when the Group IV elements include a trivalent Group IV element and a tetravalent Group IV element, a Group IV element and a Group II or Group XII element are made to be contained, and the atomic composition ratio of the Group II or Group XII element to the Group IV element is made to be less than 1 as in the first embodiment. This configuration makes the aluminum nitride film close to electroneutrality, thereby improving the FOM. The atomic ratio of the tetravalent Group IV element to the sum of the trivalent Group IV element and the tetravalent Group IV element ($M^{4+}/(M^{4+}+M^{3+})$ wherein M represents the Group IV element) is, for example, 0.5 or greater and 0.99 or less. The atomic ratio $M^{4+}/(M^{4+}+M^{3+})$ is preferably 0.7 or greater and 0.97 or less, more preferably 0.8 or greater and 0.95 or less.

When the Group IV element in the aluminum nitride film is hafnium, hafnium tends to be trivalent. Thus, by making the atomic composition ratio of the Group II or Group XII element to the Group IV element less than 1, the FOM is improved. In addition, when the aluminum nitride film is formed by reactive sputtering, the Group IV element reacts with $N_2$ on the target surface, and MN containing a trivalent Group IV element M may be produced. The valence of sputtered particles is affected by the valence of a target before sputtered. Thus, when a target containing the trivalent Group IV element M is sputtered, the trivalent state may exist in M that have substituted for an AL site in the aluminum nitride film. Thus, by making the atomic composition ratio of the Group II or Group XII element to the Group IV element less than 1, the FOM is improved.

Although the embodiments of the present invention have been described in detail, it is to be understood that the various change, substitutions, and alterations could be made hereto without departing from the spirit and scope of the invention.

What is claimed is:

1. An aluminum nitride film containing a Group IV element and a Group II or Group XII element,
    wherein an atomic composition ratio of the Group II or Group XII element to the Group IV element is less than 1; and
    wherein the Group IV element includes both a trivalent Group IV element and a tetravalent Group IV element.

2. The aluminum nitride film according to claim 1, wherein
    the atomic composition ratio is 0.5 or greater.

3. The aluminum nitride film according to claim 1, wherein an atomic composition ratio of the Group IV element to a sum of aluminum, the Group IV element, and the Group II or Group XII element is 5 atomic % or less.

4. The aluminum nitride film according to claim 1, wherein
    the Group IV element and the Group II or Group XII element substitute for aluminum.

5. The aluminum nitride film according to claim 1, wherein
    the Group IV element is at least one of titanium, zirconium, and hafnium, and
    the Group II or Group XII element is at least one of magnesium, calcium, strontium, and zinc.

6. The aluminum nitride film according to claim 5, wherein
    the Group IV element is hafnium.

7. An acoustic wave device comprising:
    the aluminum nitride film according to claim 1, and
    an electrode that excites an acoustic wave propagating through the aluminum nitride film.

8. The aluminum nitride film according to claim 1, wherein
    the atomic ratio of the tetravalent Group IV element to the sum of the trivalent Group IV element and the tetravalent Group IV element is 0.5 or greater and 0.99 or less.

9. An acoustic wave device comprising
    a resonator including:
        a substrate,
        the aluminum nitride film according to claim 1, the aluminum nitride film being located on the substrate, and
        a lower electrode and an upper electrode facing each other across at least a part of the aluminum nitride film.

10. A filter comprising:
    the acoustic wave device according to claim 9.

11. A multiplexer comprising
    the filter according to claim 10.

* * * * *